United States Patent
Lee

(10) Patent No.: US 8,027,193 B2
(45) Date of Patent: Sep. 27, 2011

(54) SEMICONDUCTOR MEMORY DEVICE HAVING BIT LINE DISTURBANCE PREVENTING UNIT

(75) Inventor: Hyun-Bae Lee, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 230 days.

(21) Appl. No.: 12/461,236

(22) Filed: Aug. 5, 2009

(65) Prior Publication Data

US 2010/0110772 A1 May 6, 2010

(30) Foreign Application Priority Data

Nov. 3, 2008 (KR) .................. 10-2008-0108257

(51) Int. Cl.
*G11C 11/34* (2006.01)

(52) U.S. Cl. .............. 365/185.02; 365/185.21; 365/196; 365/189.05

(58) Field of Classification Search .............. 365/185.02, 365/185.21, 196, 189.05
See application file for complete search history.

(56) References Cited

U.S. PATENT DOCUMENTS

| 5,023,841 A | 6/1991 | Akrout et al. |
| 6,424,554 B1 | 7/2002 | Kawasumi |
| 2002/0136051 A1 | 9/2002 | Hardee et al. |
| 2004/0114420 A1* | 6/2004 | Hsu et al. ..................... 365/149 |

FOREIGN PATENT DOCUMENTS

KR   10-0633175   9/2006

* cited by examiner

*Primary Examiner* — Jason Lappas
(74) *Attorney, Agent, or Firm* — Harness, Dickey & Pierce

(57) ABSTRACT

A read data path circuit for use in the semiconductor memory device includes a bit line sense amplifier, a local input/output line sense amplifier, a column selection unit operationally coupling a bit line pair with the local input/output line pair in response to a column selection signal, where the bit line pair is coupled to the bit line sense amplifier and the local input/output line pair is coupled to the local input/output line sense amplifier, and a bit line disturbance preventing unit configured to equalize signal levels of the local input/output line pair before the column selection signal is activated, and configured to sense and amplify signal levels of bit line data transferred to the local input/output line pair after the column selection signal is activated.

20 Claims, 7 Drawing Sheets

(CONVENITIONAL ART)

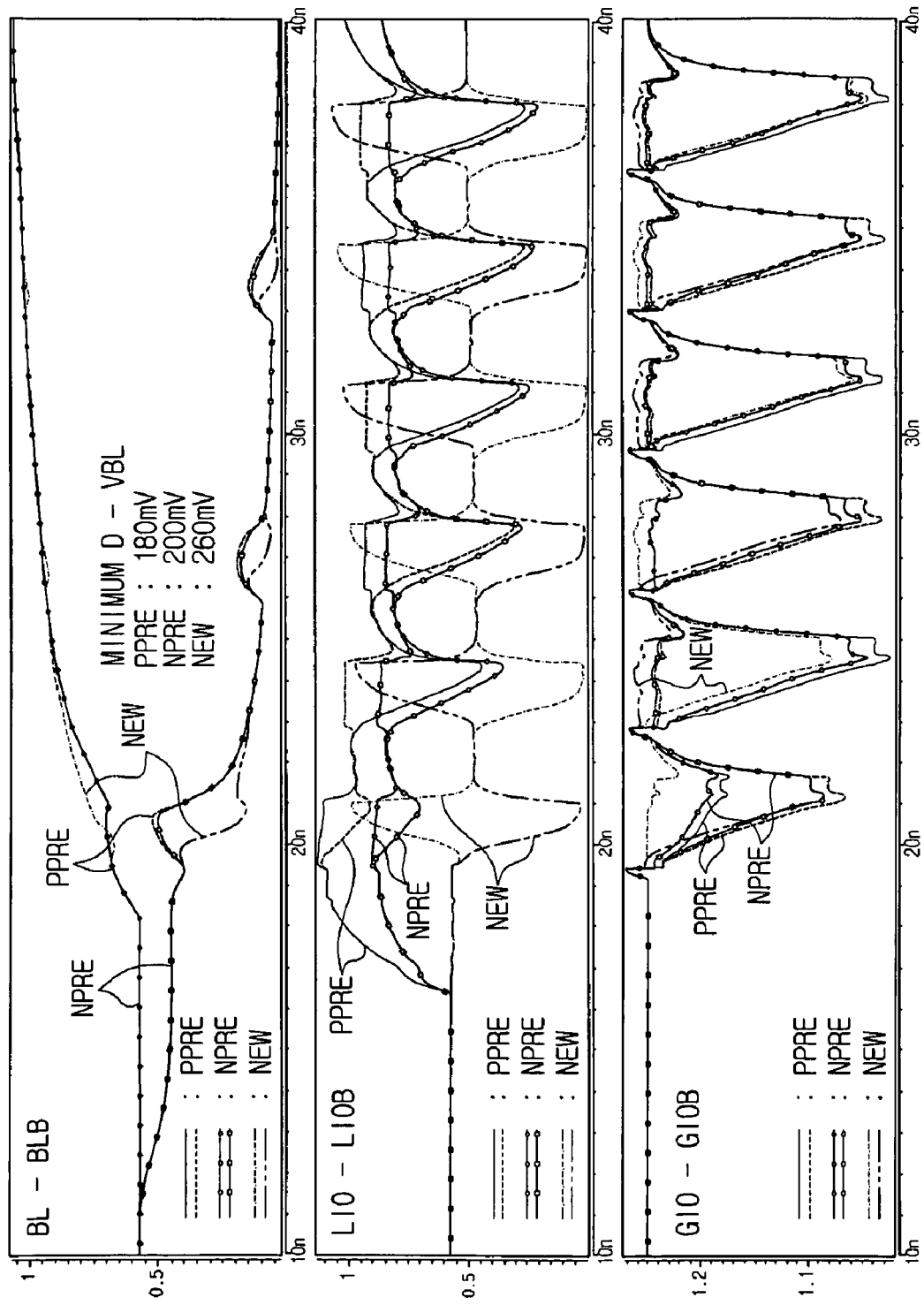

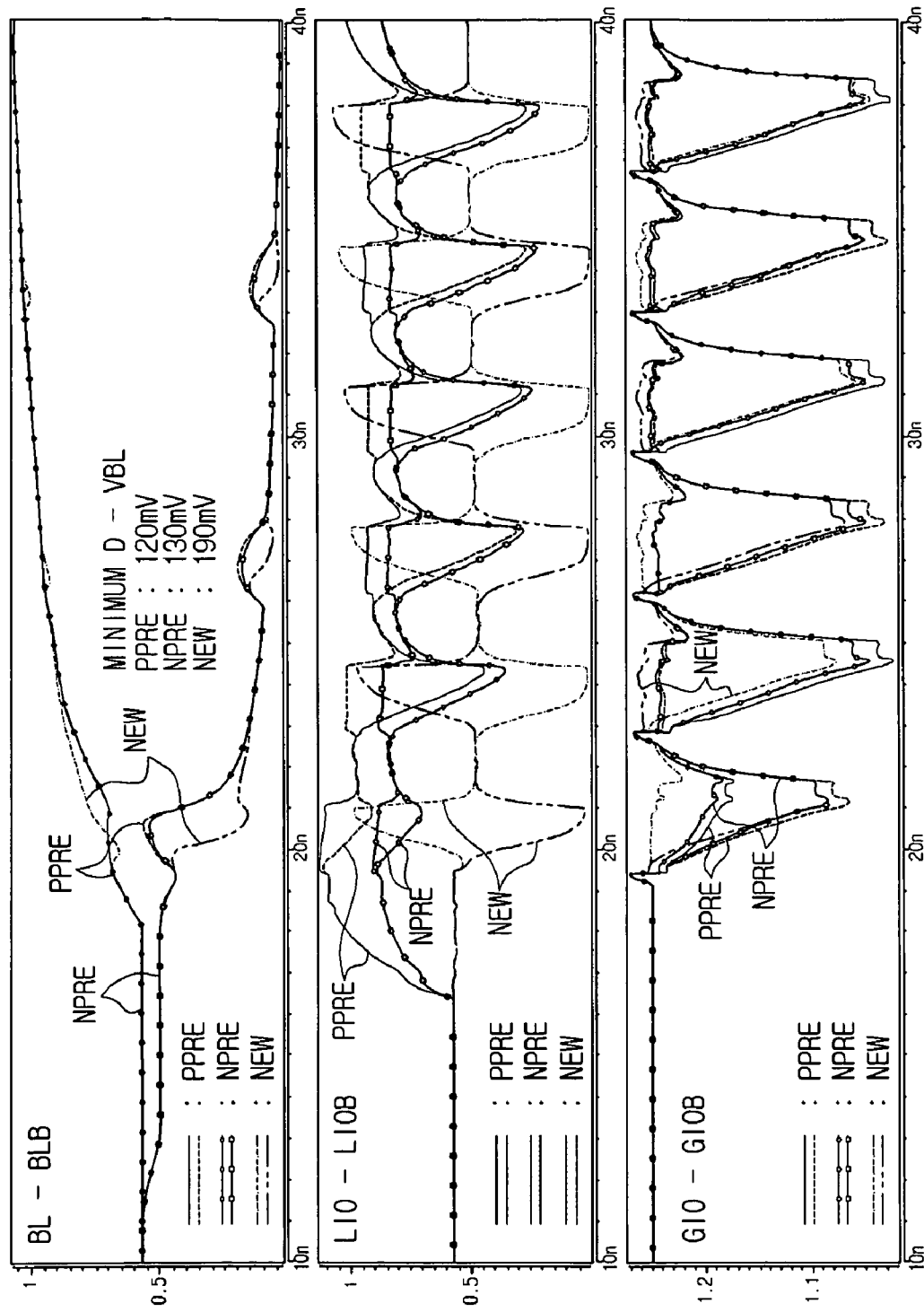

US 8,027,193 B2

SEMICONDUCTOR MEMORY DEVICE HAVING BIT LINE DISTURBANCE PREVENTING UNIT

PRIORITY STATEMENT

This application claims priority under 35 U.S.C. §119 from Korean Patent Application 10-2008-0108257, filed on Nov. 3, 2008, the contents of which are hereby incorporated by reference in their entirety as if fully set forth herein.

BACKGROUND

1. Field

Example embodiments relate to a semiconductor memory device, for example, to a read data path circuit for use in a semiconductor memory device, such as a dynamic random access memory.

2. Description of the Related Art

In general, the semiconductor memory device, e.g., a dynamic random access memory, is increasingly operating at relatively higher speeds and becoming relatively more integrated due to user requirements. A dynamic random access memory device including one access transistor and one storage capacitor as a unit memory cell is generally employed as a main memory of an electronic system.

As illustrated in FIG. 1, a dynamic random access memory device 10 (hereinafter, referred to as 'DRAM') employed in a conventional data processing system is coupled to a micro processing unit 2 through a system bus B1 and functions as a main memory. For example, the micro processing unit 2 of the data processing system is coupled to a flash memory 4 through a system bus B5, and controls a drive unit 6 through a control bus B2 by performing a processing operation determined by a program stored in the flash memory 4. In controlling the drive unit 6, the micro processing unit 2 may perform a data access operation of writing data to a memory cell of the DRAM 10 and reading the written data from the memory cell, in order to perform the processing operation.

In the read operation of DRAM 10, data stored in the memory cell is sensed and amplified on a bit line pair by a bit line sense amplifier (hereinafter, referred to as "BLSA"), and then is transferred to a local input/output line pair when a column selection line (hereinafter, referred to as 'CSL') is activated. In an example of a method to transfer bit line data to the local input/output line pair, a precharge operation for the local input/output line pair may be performed and a potential difference may develop.

In this case, before the CSL is activated, the local input/output line pair is precharged to a given voltage level. At this time, when the CSL is activated, the precharged-charge escapes from one line of the local input/output line pair to one bit line of the bit line pair. Accordingly, a potential difference between a complementary local input/output line and a local input/output line constituting the local input/output line pair is developed, and an amplitude of the potential difference may increase as time lapses.

In a read data path circuit of DRAM performing an operation of applying data provided from the memory cell to an output buffer in a read operation and in employing the scheme of precharging the local input/output line, a bit line disturbance may occur, thus a measurement thereto may be required.

SUMMARY

Example embodiments provide a semiconductor memory device capable of reducing or preventing a bit line disturbance by excluding a precharge operation of a local input/output line.

According to an example embodiment, a read data path circuit for use in a semiconductor memory device includes a bit line sense amplifier, a local input/output line sense amplifier, a column selection unit operationally coupling a bit line pair with the local input/output line pair in response to a column selection signal, where the bit line pair is coupled to the bit line sense amplifier and the local input/output line pair is coupled to the local input/output line sense amplifier, and a bit line disturbance preventing unit configured to equalize signal levels of the local input/output line pair before the column selection signal is activated, and configured to sense and amplify signal levels of bit line data transferred to the local input/output line pair after the column selection signal is activated.

In an example embodiment, the bit line disturbance preventing unit includes, an equalizing unit configured to equalize the signal levels of the local input/output line pair to a same level in response to a local input/output line equalizing signal, and an auxiliary sense amplifier unit configured to sense and amplify the signal levels of the bit line data transferred to the local input/output line pair in response to a local input/output line sense enable signal applied after the column selection signal is activated.

In an example embodiment, the equalizing unit includes a transmission gate, where the transmission gate includes, a first PMOS transistor having a gate receiving a local input/output line equalizing signal, a source coupled to one of first and second local input/output lines of the local input/output line pair, and a drain coupled to another of the first and second local input/output lines of the local input/output line pair, where the PMOS transistor is configured to equalize a potential of the local input/output line pair to a same level before the column selection signal is activated, and a first NMOS transistor having a gate receiving an inverted signal of the local input/output line equalizing signal, a drain coupled to one of first and second local input/output lines of the local input/output line pair, and a source coupled to another of the first and second local input/output lines of the local input/output line pair, where the NMOS transistor is configured to equalize a potential of the local input/output line pair to a same level before the column selection signal is activated.

In an example embodiment, the auxiliary sense amplifier unit further includes, a first amplifier unit including, a second PMOS transistor turned on in response to the local input/output line sense amplifier being activated, a third PMOS transistor having a source coupled to a drain of the second PMOS transistor, a drain coupled to the first local input/output line of the local input/output line pair, and a gate coupled to the second local input/output line of the local input/output line pair, and a fourth PMOS transistor having a source coupled to the drain of the second PMOS transistor, a drain coupled to the second local input/output line of the local input/output line pair, and a gate coupled to the first local input/output line of the local input/output line pair.

In an example embodiment, the auxiliary sense amplifier unit further includes, a second amplifier unit including, a second NMOS transistor turned on in response to the local input/output line sense amplifier being activated, a third NMOS transistor having a source coupled to a drain of the second NMOS transistor, a drain is coupled to the first local input/output line of the local input/output line pair, and a gate coupled to the second local input/output line of the local input/output line pair, and a fourth NMOS transistor having a source coupled to the drain of the second NMOS transistor, a drain coupled to the second local input/output line of the local input/output line pair, and a gate coupled to the first local input/output line of the local input/output line pair.

In an example embodiment, the bit line disturbance preventing unit is further configured to provide signals on the local input/output line pair to the local input/output line sense amplifier.

In an example embodiment, the circuit further includes a memory cell array including a plurality of memory cells, each memory cell including an access transistor and a storage capacitor, and a global input/output line sense amplifier coupled to the local input/output line sense amplifier through a global input/output line pair, wherein the bit line pair is coupled with the memory cells.

In an example embodiment, the bit line sense amplifier includes a p-type sense amplifier and an n-type sense amplifier.

According to an example embodiment, a semiconductor memory device includes a memory cell array including a plurality of memory cells, each memory cell including an access transistor and a storage capacitor, a bit line pair coupled with the memory cells, a bit line sense amplifier coupled to the bit line pair, a local input/output line sense amplifier coupled to the local input/output line pair, a column selection unit operationally coupling the bit line pair with the local input/output line pair in response to a column selection signal, where the bit line pair is coupled to the bit line sense amplifier and the local input/output line pair is coupled to the local input/output line sense amplifier, and a bit line disturbance preventing unit configured to equalize the local input/output line pair without precharging the local input/output line pair before the column selection signal is activated.

According to an example embodiment, a read data path circuit for use in a semiconductor memory device includes a disturbance preventing unit including a transmission gate, where the transmission gate includes a first PMOS transistor having a gate receiving a local input/output line equalizing signal, a source coupled to one of first and second local input/output lines of a local input/output line pair, and a drain coupled to another of the first and second local input/output lines of the local input/output line pair, where the first PMOS transistor is configured to equalize a potential of the local input/output line pair to a same level before the column selection signal is activated and a first NMOS transistor having a gate receiving an inverted signal of the local input/output line equalizing signal, a drain coupled to one of first and second local input/output lines of the local input/output line pair, and a source coupled to another of the first and second local input/output lines of the local input/output line pair, where the first NMOS transistor is configured to equalize a potential of the local input/output line pair to a same level before the column selection signal is activated.

BRIEF DESCRIPTION OF THE DRAWINGS

The above and other features and advantages will become more apparent by describing in detail example embodiments thereof with reference to the attached drawings in which:

FIGS. 7 and 8 illustrate waveforms of a comparison simulation of the circuit of FIG. 4.

DETAILED DESCRIPTION

Figure 1:
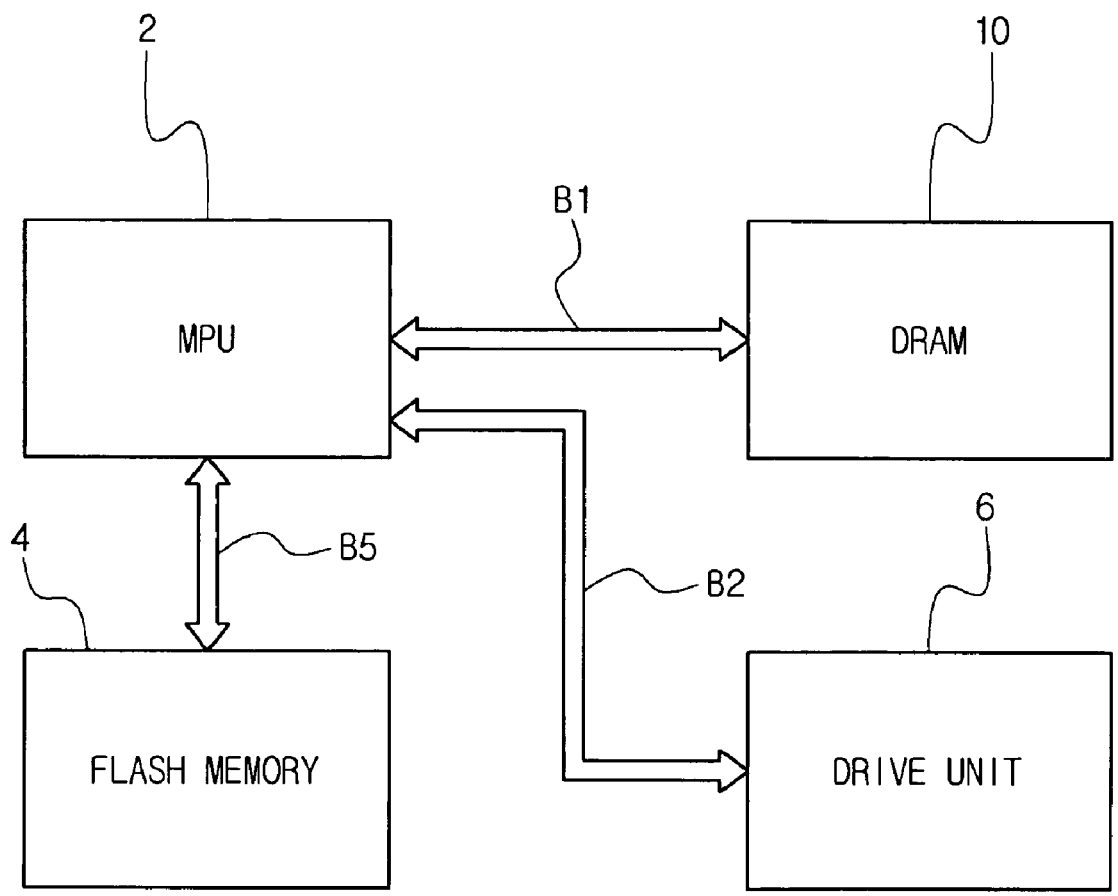
FIG. 1 is a block diagram of a conventional data processing system.

Example embodiments of a semiconductor memory device capable of reducing or preventing a bit line disturbance in a read operation are described as follows, referring to the accompanying drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures. The figures are intended to depict example embodiments and should not be interpreted to limit the intended scope of the claims. The accompanying figures are not to be considered as drawn to scale unless explicitly noted. In the drawings, the thicknesses of layers and regions may be exaggerated for clarity.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof. In this specification, the term "and/or" picks out each individual item as well as all combinations of them.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Now, in order to more specifically describe example embodiments, example embodiments will be described in detail with reference to the attached drawings. However, example embodiments are not limited to the embodiments described herein, but may be embodied in various forms. In the figures, if a layer is formed on another layer or a substrate, it means that the layer is directly formed on another layer or a substrate, or that a third layer is interposed there between.

When it is determined that a detailed description related to a related known function or configuration may make the purpose of example embodiments unnecessarily ambiguous, the detailed description thereof will be omitted. Also, terms used herein are defined to appropriately describe example embodiments and thus may be changed depending on a user, the intent of an operator, or a custom. Accordingly, the terms must be defined based on the following overall description within this specification.

Figure 2:
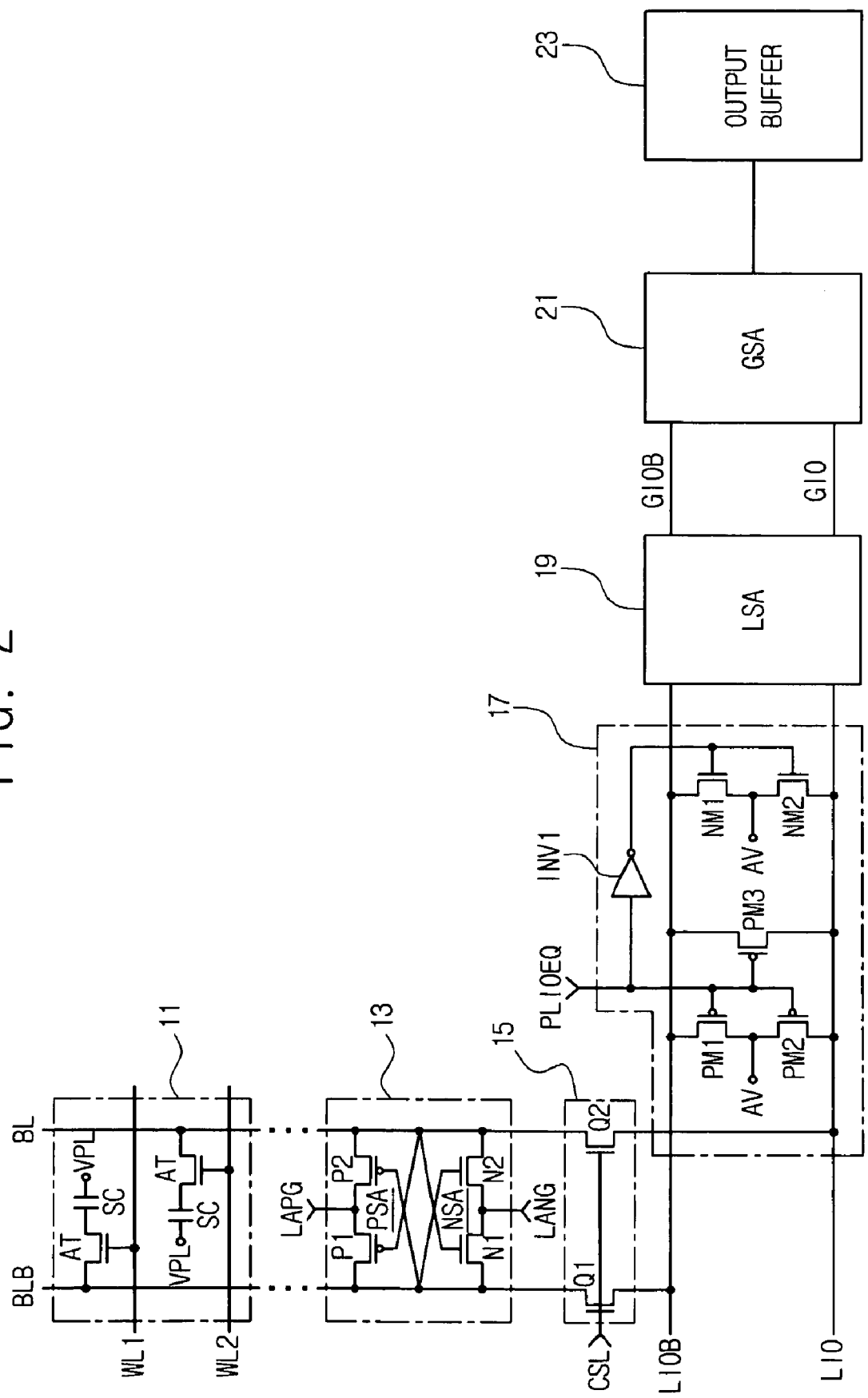
FIG. 2 is a circuit diagram of a read data path circuit including a local input/output line precharge according to a related art.

FIG. 2 is a circuit diagram of a read data path circuit including a local input/output line precharge according to a related art.

In FIG. 2, a read data path circuit of a DRAM includes a memory cell array 11, a bit line sense amplifier 13, a column selection unit 15, a local input/output line precharge and equalizing unit 17, a local input/output line sense amplifier 19, a global input/output line sense amplifier 21 and an output buffer 23.

In the memory cell array 11, each memory cell includes one access transistor AT and one storage capacitor SC connected in series. Word lines WL1 and WL2 are each coupled to a gate of one of the access transistors AT of one of the memory cells, and a bit line pair including a bit line BL and a complementary bit line BLB are each coupled with one of a drain/source of the access transistors AT of one of the memory cells. While only two memory cells, two word lines WL1 and WL2, and one bit line pair BL and BLB are shown for the memory cell array 11 in FIG. 2, it will be appreciated that the memory cell array 11 may include a greater or lesser number of memory cells, word lines, and bit line pairs.

The bit line sense amplifier 13 is coupled to the bit line pair, and senses and amplifies data stored in a memory cell that is selected within the memory cell array 11 and appears as a potential difference on the bit line pair in a read operation. Within the bit line sense amplifier 13, PMOS transistors P1 and P2 are connected in series and NMOS transistors N1 and N2 are connected in series. Further, a source/drain of each of the PMOS transistor P1 and NMOS transistor N1 is coupled to the complementary bit line BLB, and a gate of each of the PMOS transistor P1 and NMOS transistor N1 is coupled to the bit line BL. A source/drain of each of the PMOS transistor P2 and NMOS transistor N2 is coupled to the bit line BL, and a gate of each of the PMOS transistor P1 and NMOS transistor N1 is coupled to the complementary bit line BLB. A signal LAPG connects at a node between PMOS transistors P1 and P2 and a signal LANG connects at a node between NMOS transistors N1 and N2.

The column selection unit 15 operationally couples the bit line pair BL, BLB to a local input/output line pair LIO, LIOB coupled to the local input/output line sense amplifier 19 in response to the column selection signal CSL received at gates of NMOS transistors Q1 and Q2, with NMOS transistor Q1 being coupled between the complementary bit line BLB and complementary local input/output line LIOB, and NMOS transistor Q2 being coupled between the bit line BL and local input/output line LIO. Thus, the sensed and amplified data on the bit line pair BL, BLB in the read operation is respectively transferred to the local input/output line pair LIO, LIOB.

Before the column selection signal CSL is activated, the local input/output line precharge and equalizing unit 17 performs an equalization by precharging the local input/output line pair LIO, LIOB to a level of internal power voltage AV. Thus, the local input/output line pair LIO, LIOB maintains a precharged state of a given voltage level before the read operation. Within the local input/output line precharge and equalizing unit 17, PMOS transistors PM1 and PM2 and NMOS transistors NM1 and NM2 are transistors related to the precharge operation, and a PMOS transistor PM3 is related to the equalizing operation.

In FIG. 2, the PMOS transistors PM1 and PM2 are connected in series, with first PMOS transistor PM1 having a source coupled to a drain of second PMOS transistor PM2, a drain coupled to the complementary local input/output line LIOB of the local input/output line pair, and a gate receiving a local input/output line equalizing signal PLIOEQ. The second PMOS transistor PM2 further has a source coupled to the other local input/output line LIO of the local input/output line pair and a gate receiving the local input/output line equalizing signal PLIOEQ. The third PMOS transistor PM3 is coupled between local input/output line pair LIOB and LIO and has a gate receiving the local input/output line equalizing signal PLIOEQ.

The NMOS transistors NM1 and NM2 are connected in series, with first NMOS transistor NM1 having a drain coupled to a source of second NMOS transistor NM2, a source coupled to the complementary local input/output line LIOB of the local input/output line pair, and a gate receiving an inverted local input/output line equalizing signal PLIOEQ. The second NMOS transistor NM2 further has a drain coupled to the other local input/output line LIO of the local input/output line pair and a gate receiving the inverted local input/output line equalizing signal PLIOEQ.

In the read operation, the local input/output line sense amplifier 19 senses and amplifies data of the memory cell transferred to the local input/output line pair LIO, LIOB, and outputs the data to the global input/output line pair GIO, GIOB. The global input/output line sense amplifier 21 finally senses and amplifies the data of the memory cell transferred to the global input/output line GIO, GIOB, and applies the data to the output buffer 23.

In the read data path circuit of DRAM such as in FIG. 2, a bit line disturbance may be caused by the precharge operation of the local input/output line precharge and equalizing unit 17.

For example, assuming that data without a charge storage in a memory cell has a state "0," and data with a charge storage in the memory cell has a state "1," if data of a selected memory cell is "0;" a potential of the bit line BL in the bit line pair is sensed and amplified by the bit line sense amplifier 13 as having a state of lower than a potential of the complementary bit line BLB and then is transferred to a local input/output line LIO of the local input/output line pair through a column selection transistor Q2 of the column selection unit 15. In an initial sensing, when the column selection signal CSL is activated and the local input/output line sense amplifier 19 starts to operate, a potential difference between the bit line pair BL and BLB is not generally sufficient. Thus, a charge precharged in the local input/output line LIO may be output to the bit line BL through the column selection transistor Q2 so as to increase a potential of the bit line BL. However, when the potential of the bit line BL increases, an amplitude of the potential difference between the bit line pair BL and BLB may become reduced. Such an effect may be called a bit line disturbance.

For example, in the bit line disturbance effect, when a precharged-charge is transferred from one line of the local input/output line pair to a bit line having a relatively low potential in the bit line pair, a reverse or incorrect sensing may be caused due to a mismatch or misreading by the bit line sense amplifier (hereinafter, referred to as "BLSA") occurs at the initial sensing operation.

To reduce such bit line disturbance there have been several tries to maintain a precharge level of local input/output line pair at a low level.

On the other hand, the circuit structure of FIG. 2 may selectively employ one of PMOS precharge transistors PM1 and PM2 and NMOS precharge transistors NM1 and NM2. When the PMOS precharge transistors PM1 and PM2 are selectively used, a precharge potential of the local input/output line pair may be maintained at a relatively high level, and thus be relatively more susceptible to the bit line disturbance as compared to selectively using the NMOS precharge transistors NM1 and NM2.

When selectively using the NMOS precharge transistors NM1 and NM2 to ensure a stronger resistance to the bit line disturbance, a potential difference between the local input/output line pair provided after data is loaded becomes relatively small and data transferred to a global input/output line pair becomes susceptible to the mismatch or misreading in determining a potential difference. Although to improve such susceptibility, the LSA 19 may be employed as shown in FIG. 2. Selective use of a PMOS precharge and/or NMOS precharge produces a trade-off relation between the bit line disturbance and a read speed. However, for example, even if the NMOS precharge is used, it may be difficult to prevent a charge itself flowing from the local input/output line to the bit line by an inherent characteristic of the precharge. Thus the bit line disturbance may inevitably occur.

In example embodiments, such a precharge scheme may be excluded, and a new schema employing an equalization operation without using the precharge scheme may be provided, as shown below in FIG. 3.

Figure 3:
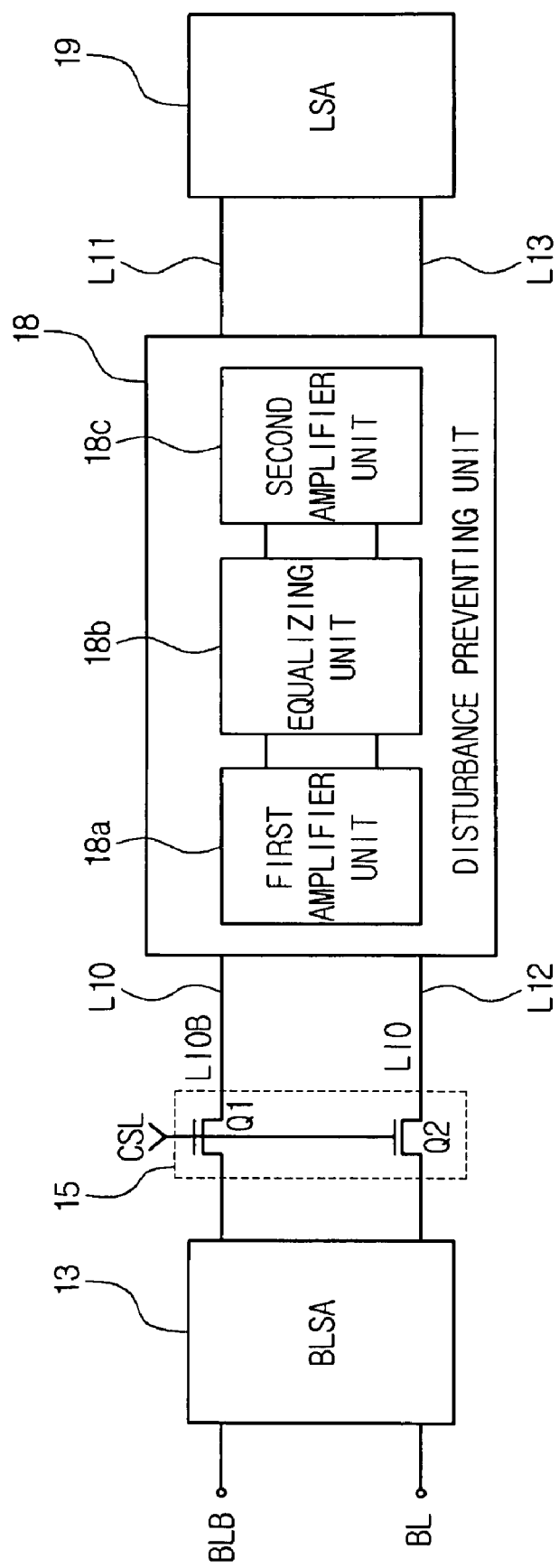
FIG. 3 is a circuit diagram of a read data path circuit including a disturbance preventing unit according to an example embodiment.
Figure 4:
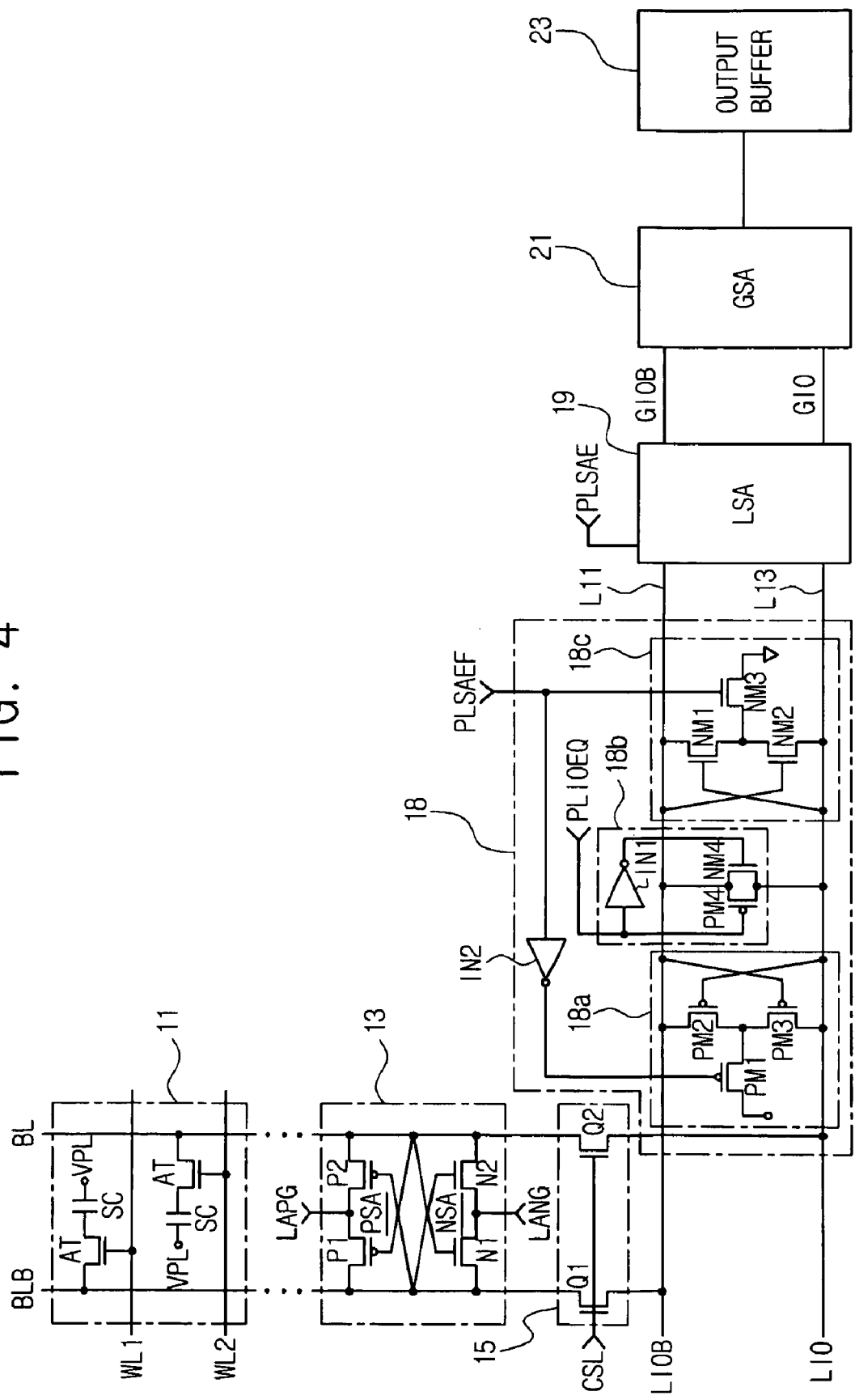
FIG. 4 is a circuit diagram illustrating in more detail the read data path circuit of FIG. 3.

FIG. 3 is a circuit diagram of a read data path circuit including a disturbance-preventing unit 18 according to an example embodiment. FIG. 4 is a circuit diagram illustrating in more detail the read data path circuit of FIG. 3.

Figure 5:
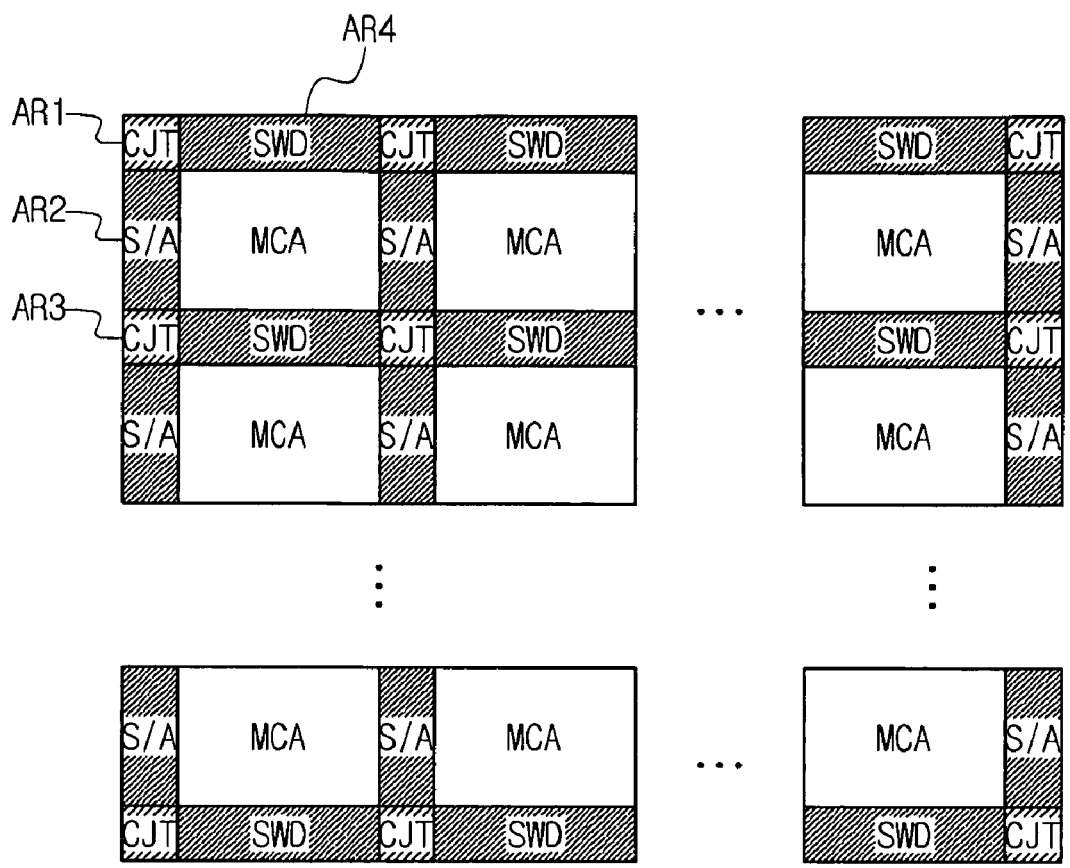
FIG. 5 illustrates a conjunction area of a semiconductor memory device including the disturbance preventing unit of FIG. 3.
Figure 6:
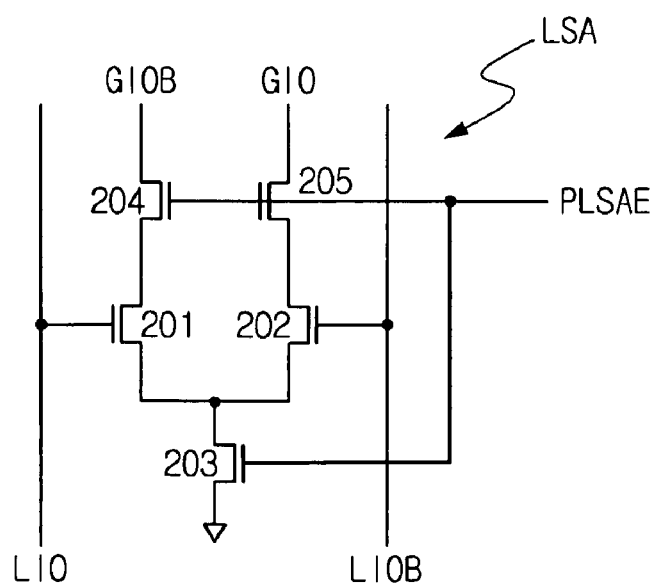
FIG. 6 provides an example of a local input/output line sense amplifier of FIG. 3.

FIG. 5 illustrates a conjunction area of a semiconductor memory device including the disturbance-preventing unit of FIG. 3. FIG. 6 provides an example of a local input/output line sense amplifier of FIG. 3.

FIGS. 7 and 8 illustrate waveforms of a comparison simulation of the circuit of FIG. 4.

In FIG. 3 there is shown a connection structure of the read data path circuit including a bit line sense amplifier BLSA 13, a local input/output line sense amplifier LSA 19, a column selection unit 15 (Q1,Q2) and a bit line disturbance preventing unit 18.

The column selection transistors Q1 and Q2 constituting the column selection unit 15 serve to operationally couple the bit line pair BL, BLB, which are also coupled to the bit line sense amplifier 13, to the local input/output line pair LIO, LIOB, which are also coupled to the local input/output line sense amplifier 19, in response to a column selection signal CSL.

The disturbance preventing unit 18 includes first and second amplifier units 18*a* and 18*c* and an equalizing unit 18*b*. The disturbance preventing unit 18 equalizes the local input/output line pair LIO, LIOB before the column selection signal CSL is activated, senses and amplifies signal levels of bit line data transferred to the local input/output line pair LIO, LIOB after the column selection signal CSL is activated, and thus provides signals L11 and L13 as inputs of the local input/output line sense amplifier 19.

FIG. 4 illustrates in more detail the read data path circuit of FIG. 3. More specifically, FIG. 4 provides a circuit diagram of the first and second amplifier units 18*a* and 18*c* and the equalizing unit 18*b* adapted within the disturbance preventing unit 18. FIG. 4 further includes the memory cell array 11, the bit line sense amplifier 13, the local input/output line sense amplifier 19, the global input/output line sense amplifier 21 and the output buffer 23. The memory cell array 11, the bit line sense amplifier 13, the local input/output line sense amplifier 19, the global input/output line sense amplifier 21 and the output buffer 23 may operate the same as their corresponding elements of the read data path circuit of the DRAM illustrated in FIG. 2, and thus detailed descriptions thereof will be omitted here.

In FIG. 4 the equalizing unit 18*b* includes a first PMOS transistor PM4 having a gate receiving a local input/output line equalizing signal PLIOEQ, a source coupled to the complementary local input/output line LIOB of the local input/output line pair, and a drain is coupled to the other local input/output line LIO of the local input/output line pair, in order to equalize a potential of the local input/output line pair to the same level before an activation of the column selection signal CSL. The equalizing unit 18*b* further includes a first NMOS transistor NM4 having a gate receiving an inverted local input/output line equalizing signal PLIOEQ, having a drain coupled to the complementary local input/output line LIOB of the local input/output line pair, and a source coupled to the other local input/output line LIO of the local input/output line pair, in order to equalize to the same level, a potential of the local input/output line pair before an activation of the column selection signal CSL.

The first PMOS and NMOS transistors PM4 and NM4 constitute a transmission gate.

The first amplifier unit 18*a* of the first and second amplifier units 18*a* and 18*c* constituting the auxiliary sense amplifier includes a second PMOS transistor PM1 turned on in response to an activation of the local input/output line sense amplifier 19. The first amplifier unit 18*a* further includes a third PMOS transistor PM2 having a source coupled to a drain of the second PMOS transistor PM1, a drain coupled to the complementary local input/output line LIOB of the local input/output line pair, and a gate coupled to the other local input/output line LIO of the local input/output line pair. The first amplifier unit 18a also includes a fourth PMOS transistor PM3 having a source coupled to a source of the second PMOS transistor PM2, a drain coupled to the complementary local input/output line LIOB, and a gate coupled to the other local input/output line LIO.

The second amplifier unit 18c includes a second NMOS transistor NM3 turned on in response to an activation of the local input/output line sense amplifier 19. The second amplifier unit 18c further includes a third NMOS transistor NM1 having a source coupled to a drain of the second NMOS transistor NM3, a drain coupled to the complementary local input/output line LIOB of the local input/output line pair, and a gate coupled to the other local input/output line LIO of the local input/output line pair. The second amplifier unit 18c also includes a fourth NMOS transistor NM2 having a source coupled to a drain of the second NMOS transistor NM3, a drain coupled to the other local input/output line LIO, and a gate coupled to the local input/output line LIOB.

In the circuit structure of FIG. 4, unlike that of FIG. 2 with the LIO precharge, the auxiliary sense amplifier of a bit line sense amplifier type and an LIO equalization are employed between the local input/output line pair. For example, by not performing the LIO precharge as described above in FIG. 2, an effect of a precharged-charge flowing into a bit line of the bit line pair having a relatively low potential from one line of the local input/output line pair at an initial sensing operation, can be reduced or prevented. Thus, the bit line disturbance may be prevented. According to the example embodiment of FIG. 4, the circuit structure can reduce the bit line disturbance effect by approximately 30% more as compared with the LIO precharge circuit of FIG. 2.

In FIG. 4, the first and second amplifier units 18a and 18c constituting the auxiliary sense amplifier are adapted to compensate for an incomplete amplitude within conjunction areas AR1 and AR3 shown in FIG. 5. The first and second amplifier units 18a and 18c may be configured in a same type as a p-type sense amplifier PSA and an n-type sense amplifier NSA that constitute a bit line type sense amplifier.

As a result, in FIG. 4, the equalizing unit 18b employing a transmission gate including the first PMOS and NMOS transistors PM4 and NM4 may ensure a common mode of a relatively large area, and simultaneously provide a resistance increase to a mismatch generated from a semiconductor characteristic and a sensing speed increase.

The first and second amplifier units 18a and 18c of the BLSA type are adapted to prevent an amplitude of potential difference from being reduced when bit line data is transferred to local input/output line pair having a relatively large loading, as compared with the bit line pair, by using the local input/output line equalizing signal PLIOEQ. The auxiliary sense amplifier is provided herein as a type of BLSA. Thus, the auxiliary sense amplifier may serve as an amplifier of latch type capable of obtaining a relatively high gain with a relatively small current consumption.

Describing operation of the circuit diagram in FIG. 4 in more detail, the local input/output line equalizing signal PLIOEQ is applied at a high level before the column selection signal CSL is activated. When the signal PLIOEQ is activated, the transmission gate PM4, NM4 is turned on and thus a potential level between the local input/output line pair LIO, LIOB becomes equal. Here, an inverter IN1 functions as inverting a logic level of the local input/output line equalizing signal received by the gate of the NMOS transistor NM4. When the potential level becomes equal, the potential level maintains a level that is approximately half an internal power voltage. For example, when the internal power voltage is 1.2V, the potential level is approximately 0.6V. When the column selection signal CSL is activated, the local input/output line equalizing signal PLIOEQ is inactivated by being applied at a low level and the transmission gate PM4, NM4 is turned off.

When the column selection signal CSL is activated and the local input/output line sense amplifier 19 receives a sense amplifier enable signal PLSAE to start a sensing operation, the first and second amplifier units 18a and 18c of the BLSA type start to perform a sensing and amplification operation by receiving an auxiliary sense amplifier enable signal PLSAEF applied at a high level at the gate of the second NMOS transistor NM3. An inverter INV2 is adapted to invert a logic level of the auxiliary sense amplifier enable signal PLSAEF and output the inverted auxiliary sense amplifier enable signal PLSAEF to the gate of the second PMOS transistor PM1. The operation of the first and second amplifier units 18a and 18c may be substantially the same as an operation of the bit line sense amplifier, and thus detailed descriptions thereof will be omitted here.

FIG. 5 illustrates a conjunction area of a semiconductor memory device in which the disturbance preventing unit 18 of FIG. 3 is adapted. In FIG. 5, sub word line drivers SWD AR4 and bit line sense amplifiers S/A AR2 are disposed on the periphery of memory cell array, and the conjunction areas AR1 and AR3 are disposed on an intersection between the sub word line driver SWD:AR4 and the bit line sense amplifier S/A:AR2. Drivers to drive the bit line sense amplifier may be disposed in the conjunction areas AR1 and AR3. According to an example embodiment, the disturbance preventing unit 18 may be designed in the conjunction areas AR1 and AR3, and thus a sufficient layout margin may be obtained.

Referring to FIG. 6, an example embodiment of the local input/output line sense amplifier 19 of FIGS. 3 and 4 is provided. The local input/output line sense amplifier 19 includes NMOS transistors 201 to 205. The NMOS transistors 204 and 201 are connected in series with a terminal of the NMOS transistor 204 receiving the complementary global input/output line GIOB and a terminal of the NMOS transistor 201 coupling to a terminal of the NMOS transistor 203. The NMOS transistors 205 and 202 are connected in series with a terminal of the NMOS transistor 205 receiving the global input/output line GIO and a terminal of the NMOS transistor 202 coupling to a terminal of the NMOS transistor 203. A remaining terminal of the NMOS transistor 203 is coupled to a ground. Gates of the NMOS transistors 204 and 205 are coupled to the sense amplifier enable signal PLSAE. A gate of the NMOS transistor 201 is coupled to the local input/output line LIO and a gate of the NMOS transistor 202 is coupled to the complementary local input/output line LIOB. In operation, when the sense amplifier enable signal PLSAE is activated by being applied at a high level, the data appearing on the local input/output line pair LIO, LIOB is sensed and amplified and is applied to global input/output line pair GIO, GIOB. Timing and a signal logic level of the sense amplifier enable signal PLSAE shown in FIG. 6 and the auxiliary sense amplifier enable signal PLSAEF shown in FIG. 4 are substantially equal.

FIGS. 7 and 8 illustrate waveforms for a comparison simulation of the circuit of FIG. 4.

In FIG. 7, a capacitance of a storage capacitor SC constituting a memory cell is 25 Femtofarad (fF). In this case, an external power voltage may be 1.25V, an internal power voltage may be 1.15V, and a clock frequency of double data rate (DDR) may be 2133 Megahertz (MHz). In the graphs, a horizontal axis indicates time in nanoseconds (n), and a vertical axis indicates a voltage in volts (V).

In FIG. 7, an uppermost graph denotes a potential development between the bit line pair BL and BLB, a middle graph denotes a potential development between the local input/output line pair LIO and LIOB, and a lowermost graph denotes a potential development between the global input/output line pair GIO and GIOB. Six consecutive waveforms shown in the middle graph and the lowermost graph indicate an execution of a burst read operation.

A graph reference character indicating an effect of an example embodiment is represented as "NEW." Furthermore, the reference character "NPRE" indicates a related art, such as that of FIG. 2, using an NMOS precharge scheme, and the reference character "PPRE" indicates a general art employing a PMOS precharge scheme.

As illustrated by "NEW" in the uppermost graph of FIG. 7, a relatively significant potential difference in amplitude between the bit line pair BL and BLB of 260 mV is obtained through the example embodiment, which employs a scheme excluding the precharge, as compared with the related art NPRE, which obtains a potential difference amplitude of 200 mV. Likewise, in the middle graph and lowermost graph of FIG. 7, the potential difference illustrated by "NEW" is greater than that of NPRE or PPRE for the local input/output line pair LIO and LIOB and the global input/output line pair GIO and GIOB, respectively.

Similarly, in FIG. 8, a capacitance of a storage capacitor SC constituting a memory cell is 17 fF. In this case, as in FIG. 7, an external power voltage 1.25V, and an internal power voltage is 1.15V, and a clock frequency of DDR is 2133 MHz. In the graphs, a horizontal axis indicates time in nanoseconds (n), and a vertical axis indicates a voltage in volts (V).

In FIG. 8, an uppermost graph denotes a potential development between the bit line pair BL and BLB, a middle graph denotes a potential development between the local input/output line pair LIO and LIOB, and a lowermost graph denotes a potential development between the global input/output line pair GIO and GIOB. Six consecutive waveforms shown in the middle graph and the lowermost graph indicate an execution of burst read operation taken.

A graph reference character indicating an effect of an example embodiment is represented as "NEW." Furthermore, the reference character "NPRE" indicates a related art, such as that of FIG. 2, using an NMOS precharge scheme, and the reference character "PPRE" indicates a general art employing a PMOS precharge scheme.

As illustrated by "NEW" in the uppermost graph of FIG. 8, a relatively significant potential difference in amplitude between the bit line pair BL and BLB of 190 mV is obtained, as compared with the related art NPRE, which obtains a potential difference amplitude of 130 mV. Likewise, in the middle graph and lowermost graph of FIG. 8, the potential difference illustrated by "NEW" is greater than that of NPRE or PPRE for the local input/output line pair LIO and LIOB and the global input/output line pair GIO and GIOB, respectively.

As illustrated in FIGS. 7 and 8, example embodiments may reduce or prevent the bit line disturbance more effectively than the related art or general art in the same CSL enable time. In addition, a comparatively dominant disturbance prevention effect can be obtained even in a memory cell capacitance of a relatively small capacity from which the bit line disturbance effect is generally generated relatively often.

Even after further installing the auxiliary sense amplifier in the conjunction area, a total current consumption amount of example embodiments is not relatively greater compared with the structure of the related art in FIG. 2 performing a precharge. As a common mode of the local input/output line pair LIO-LIOB is relatively lowered, a gain of local input/output line sense amplifier 19 becomes relatively greater, and the current consumption amount is reduced.

In example embodiments, a structure for allowing a charge flowing from a local input/output line to a bit line may be cut off or removed. Accordingly, a bit line disturbance may be effectively reduced or prevented, and an overall read performance and read speed of DRAM may increases. Additionally, in example embodiments, a transistor used for a precharge may be utilized as an auxiliary sense amplifier and thus a layout of a core-conjunction may not have as great an influence.

It will be apparent to those skilled in the art that modifications and variations can be made without deviating from the spirit or scope of example embodiments. Thus, it is intended that example embodiments cover any such modifications and variations of the inventive concept provided they come within the scope of the appended claims and their equivalents. For example, in other cases, an internal coupling structure of an equalizing unit and an auxiliary sense amplifier unit may be varied without deviating the spirit of example embodiments.

Furthermore, although the DRAM is adapted as an example in the above-description, other volatile memories, e.g., pseudo SRAM etc., may be applied in example embodiments as well.

Although the example embodiments have been disclosed in the drawings and specification for illustrative purposes, those skilled in the art will appreciate that various modifications, additions and substitutions are possible, without departing from the scope and spirit of example embodiments as disclosed in the accompanying claims.

What is claimed is:

1. A read data path circuit for use in a semiconductor memory device, the circuit comprising:
   a bit line sense amplifier;
   a local input/output line sense amplifier;
   a column selection unit operationally coupling a bit line pair with the local input/output line pair in response to a column selection signal, where the bit line pair is coupled to the bit line sense amplifier and the local input/output line pair is coupled to the local input/output line sense amplifier; and
   a bit line disturbance preventing unit configured to equalize signal levels of the local input/output line pair before the column selection signal is activated, and configured to sense and amplify signal levels of bit line data transferred to the local input/output line pair after the column selection signal is activated.

2. The circuit of claim 1, wherein the bit line disturbance preventing unit comprises:
   an equalizing unit configured to equalize the signal levels of the local input/output line pair to a same level in response to a local input/output line equalizing signal; and
   an auxiliary sense amplifier unit configured to sense and amplify the signal levels of the bit line data transferred to the local input/output line pair in response to a local input/output line sense enable signal applied after the column selection signal is activated.

3. The circuit of claim 2, wherein the equalizing unit further comprises:
   a transmission gate including, a first PMOS transistor having a gate receiving the local input/output line equalizing signal, a source coupled to one of first and second local input/output lines of the local input/output line pair, and a drain coupled to another of the first and second local input/output lines of the local input/output line pair, where the PMOS transistor is configured to equalize a potential of the local input/output line pair to a same level before the column selection signal is activated; and a first NMOS transistor having a gate receiving an inverted signal of the local input/output line equalizing signal, a drain coupled to one of first and second local input/output lines of the local input/output line pair, and a source coupled to another of the first and second local input/output lines of the local input/output line pair, where the NMOS transistor is configured to equalize a potential of the local input/output line pair to a same level before the column selection signal is activated.

4. The circuit of claim 3, wherein the auxiliary sense amplifier unit further comprises:

a first amplifier unit including,
a second PMOS transistor turned on in response to the local input/output line sense amplifier being activated,
a third PMOS transistor having a source coupled to a drain of the second PMOS transistor, a drain coupled to the first local input/output line of the local input/output line pair, and a gate coupled to the second local input/output line of the local input/output line pair, and
a fourth PMOS transistor having a source coupled to the drain of the second PMOS transistor, a drain coupled to the second local input/output line of the local input/output line pair, and a gate coupled to the first local input/output line of the local input/output line pair.

5. The circuit of claim 4, wherein the auxiliary sense amplifier unit further comprises:

a second amplifier unit including,
a second NMOS transistor turned on in response to the local input/output line sense amplifier being activated,
a third NMOS transistor having a source coupled to a drain of the second NMOS transistor, a drain is coupled to the first local input/output line of the local input/output line pair, and a gate coupled to the second local input/output line of the local input/output line pair, and
a fourth NMOS transistor having a source coupled to the drain of the second NMOS transistor, a drain coupled to the second local input/output line of the local input/output line pair, and a gate coupled to the first local input/output line of the local input/output line pair.

6. The circuit of claim 2, wherein the auxiliary sense amplifier unit comprises:

a first amplifier unit including,
a second PMOS transistor turned on in response to the local input/output line sense amplifier being activated,
a third PMOS transistor having a source coupled to a drain of the second PMOS transistor, a drain coupled to the first local input/output line of the local input/output line pair, and a gate coupled to the second local input/output line of the local input/output line pair, and
a fourth PMOS transistor having a source coupled to the drain of the second PMOS transistor, a drain coupled to the second local input/output line of the local input/output line pair, and a gate coupled to the first local input/output line of the local input/output line pair; and a second amplifier unit including,
a second NMOS transistor turned on in response to the local input/output line sense amplifier being activated,
a third NMOS transistor having a source coupled to a drain of the second NMOS transistor, a drain is coupled to the first local input/output line of the local input/output line pair, and a gate coupled to the second local input/output line of the local input/output line pair, and
a fourth NMOS transistor having a source coupled to the drain of the second NMOS transistor, a drain coupled to the second local input/output line of the local input/output line pair, and a gate coupled to the first local input/output line of the local input/output line pair.

7. The circuit of claim 1, wherein the bit line disturbance preventing unit is further configured to provide signals on the local input/output line pair to the local input/output line sense amplifier.

8. The circuit of claim 7, further comprising:
a memory cell array including a plurality of memory cells, each memory cell including an access transistor and a storage capacitor; and
a global input/output line sense amplifier coupled to the local input/output line sense amplifier through a global input/output line pair, wherein
the bit line pair is coupled with the memory cells.

9. The circuit of claim 7, wherein the bit line sense amplifier includes a p-type sense amplifier and an n-type sense amplifier.

10. A semiconductor memory device comprising:
a memory cell array including a plurality of memory cells, each memory cell including an access transistor and a storage capacitor;
a bit line pair coupled with the memory cells;
a bit line sense amplifier coupled to the bit line pair;
a local input/output line sense amplifier coupled to the local input/output line pair;
a column selection unit operationally coupling the bit line pair with the local input/output line pair in response to a column selection signal, where the bit line pair is coupled to the bit line sense amplifier and the local input/output line pair is coupled to the local input/output line sense amplifier; and
a bit line disturbance preventing unit configured to equalize the local input/output line pair without precharging the local input/output line pair before the column selection signal is activated.

11. The device of claim 10, wherein the bit line disturbance preventing unit further comprises:
a transmission gate including,
a first PMOS transistor having a gate receiving a local input/output line equalizing signal, a source coupled to one of first and second local input/output lines of the local input/output line pair, and a drain coupled to another of the first and second local input/output lines of the local input/output line pair, where the PMOS transistor is configured to equalize a potential of the local input/output line pair to a same level before the column selection signal is activated, and
a first NMOS transistor having a gate receiving an inverted signal of the local input/output line equalizing signal, a drain coupled to one of first and second local input/output lines of the local input/output line pair, and a source coupled to another of the first and second local input/output lines of the local input/output line pair, where the NMOS transistor is configured to equalize a potential of the local input/output line pair to a same level before the column selection signal is activated.

12. The device of claim 11, wherein the bit line disturbance preventing unit further comprises:
a first amplifier unit including,
a second PMOS transistor turned on in response to the local input/output line sense amplifier being activated,
a third PMOS transistor having a source coupled to a drain of the second PMOS transistor, a drain coupled to the first local input/output line of the local input/output line pair, and a gate coupled to the second local input/output line of the local input/output line pair, and
a fourth PMOS transistor having a source coupled to the drain of the second PMOS transistor, a drain coupled to the second local input/output line of the local input/output line pair, and a gate coupled to the first local input/output line of the local input/output line pair.

13. The device of claim 12, wherein the bit line disturbance preventing unit further comprises:
a second amplifier unit including,
a second NMOS transistor turned on in response to the local input/output line sense amplifier being activated,
a third NMOS transistor having a source coupled to a drain of the second NMOS transistor, a drain is coupled to the first local input/output line of the local input/output line pair, and a gate coupled to the second local input/output line of the local input/output line pair, and
a fourth NMOS transistor having a source coupled to the drain of the second NMOS transistor, a drain coupled to the second local input/output line of the local input/output line pair, and a gate coupled to the first local input/output line of the local input/output line pair.

14. The device of claim 10, further comprising:
a global input/output line sense amplifier coupled to the local input/output line sense amplifier through a global input/output line pair.

15. The device of claim 14, wherein the bit line disturbance preventing unit is further configured to provide signals on the local input/output line pair to the local input/output line sense amplifier.

16. A read data path circuit for use in a semiconductor memory device, comprising:
a disturbance preventing unit including a transmission gate, where the transmission gate includes,
a first PMOS transistor having a gate receiving a local input/output line equalizing signal, a source coupled to one of first and second local input/output lines of a local input/output line pair, and a drain coupled to another of the first and second local input/output lines of the local input/output line pair, where the first PMOS transistor is configured to equalize a potential of the local input/output line pair to a same level before the column selection signal is activated, and
a first NMOS transistor having a gate receiving an inverted signal of the local input/output line equalizing signal, a drain coupled to one of first and second local input/output lines of the local input/output line pair, and a source coupled to another of the first and second local input/output lines of the local input/output line pair, where the first NMOS transistor is configured to equalize a potential of the local input/output line pair to a same level before the column selection signal is activated.

17. The circuit of claim 16, wherein the disturbance preventing unit further comprises:
a first amplifier unit including,
a second PMOS transistor turned on in response to the local input/output line sense amplifier being activated,
a third PMOS transistor having a source coupled to a drain of the second PMOS transistor, a drain coupled to the first local input/output line of the local input/output line pair, and a gate coupled to the second local input/output line of the local input/output line pair, and
a fourth PMOS transistor having a source coupled to the drain of the second PMOS transistor, a drain coupled to the second local input/output line of the local input/output line pair, and a gate coupled to the first local input/output line of the local input/output line pair.

18. The circuit of claim 17, wherein the disturbance preventing unit further comprises:
a second amplifier unit including,
a second NMOS transistor turned on in response to the local input/output line sense amplifier being activated,
a third NMOS transistor having a source coupled to a drain of the second NMOS transistor, a drain is coupled to the first local input/output line of the local input/output line pair, and a gate coupled to the second local input/output line of the local input/output line pair, and
a fourth NMOS transistor having a source coupled to the drain of the second NMOS transistor, a drain coupled to the second local input/output line of the local input/output line pair, and a gate coupled to the first local input/output line of the local input/output line pair.

19. The circuit of claim 16, further comprising:
a bit line sense amplifier;
a local input/output line sense amplifier; and
a column selection unit operationally coupling a bit line pair with the local input/output line pair in response to a column selection signal, where the bit line pair is coupled to the bit line sense amplifier and the local input/output line pair is coupled to the local input/output line sense amplifier, wherein
the bit line disturbance preventing unit is further configured to provide signals on the local input/output line pair to the local input/output line sense amplifier.

20. The circuit of claim 19, further comprising:
a memory cell array including a plurality of memory cells, each memory cell including an access transistor and a storage capacitor; and
a global input/output line sense amplifier coupled to the local input/output line sense amplifier through a global input/output line pair, wherein
the bit line pair is coupled with the memory cells.

* * * * *